US010264672B2

(12) United States Patent
Mori et al.

(10) Patent No.: US 10,264,672 B2
(45) Date of Patent: Apr. 16, 2019

(54) GLASS SUBSTRATE AND GLASS SUBSTRATE FOR HIGH FREQUENCY DEVICE

(71) Applicant: AGC Inc., Chiyoda-ku (JP)

(72) Inventors: Shigetoshi Mori, Chiyoda-ku (JP); Motoshi Ono, Chiyoda-ku (JP); Mamoru Isobe, Chiyoda-ku (JP); Kohei Horiuchi, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/962,076

(22) Filed: Apr. 25, 2018

(65) Prior Publication Data

US 2018/0317319 A1 Nov. 1, 2018

(30) Foreign Application Priority Data

Apr. 28, 2017 (JP) .................................. 2017-090675

(51) Int. Cl.
*H01B 17/56* (2006.01)
*H05K 1/03* (2006.01)
*H05K 1/11* (2006.01)

(52) U.S. Cl.
CPC .......... *H05K 1/0306* (2013.01); *H05K 1/115* (2013.01)

(58) Field of Classification Search
CPC ........ H05K 1/0306; H05K 1/115; H05K 1/03; H05K 1/11; H05K 3/00; B23K 26/00; B23K 26/0006; C03C 15/00; C03B 33/082

USPC .................. 174/167, 255, 256; 428/98, 121; 219/121.7, 121.72
See application file for complete search history.

(56) References Cited

U.S. PATENT DOCUMENTS

| 4,491,622 A * | 1/1985 | Butt ....................... H05K 1/053 174/256 |
| 8,491,983 B2 * | 7/2013 | Ono ........................ C03C 3/076 428/131 |
| 10,071,932 B2 * | 9/2018 | Kobuke .................. C03C 3/087 |
| 2017/0088457 A1 | 3/2017 | Mori | |

FOREIGN PATENT DOCUMENTS

JP          5994954          9/2016

* cited by examiner

*Primary Examiner* — Angel R Estrada
(74) *Attorney, Agent, or Firm* — Oblon, McClelland, Maier & Neustadt, L.L.P.

(57) ABSTRACT

A glass substrate includes a plurality of through holes that penetrate from a first surface to a second surface of the glass substrate. Each through hole has an upper aperture with a first diameter on the first surface and a lower aperture with a second diameter on the second surface. For each of ten through holes selected from the plurality of through holes, a side wall length is obtained from the first and second diameters and the thickness of the glass substrate, and an R value is obtained by dividing the side wall length by the thickness of the glass substrate. The R values fall within a range of 1 to 1.1. A B value, obtained from dividing a difference between the greatest R value and the smallest R value by an average of the R values followed by multiplication with 100, is 5% or less.

12 Claims, 3 Drawing Sheets

GLASS SUBSTRATE AND GLASS SUBSTRATE FOR HIGH FREQUENCY DEVICE

CROSS-REFERENCE TO RELATED APPLICATION

The present application is based on and claims benefit of priority under 35 U.S.C. § 119 of Japanese Patent Application No. 2017-090675, filed Apr. 28, 2017. The contents of the application are incorporated herein by reference in their entirety.

BACKGROUND OF THE INVENTION

1. Field of the Invention

The disclosure herein generally relates to a glass substrate, particularly relates to a glass substrate having a through hole, and a glass substrate for a high frequency device provided with the glass substrate.

2. Description of the Related Art

Conventionally, a glass substrate having through holes has been widely used. For example, a glass substrate having a plurality of through holes, in which a conductive material is filled, has been used as a glass interposer (See, e.g. Japanese Patent No. 5994954).

SUMMARY OF THE INVENTION

A range of application of the aforementioned glass substrates having through holes is expected to become larger also for high frequency devices of the next generation.

However, in such a high frequency device, even if a size of the through hole is slightly changed, characteristics of the high frequency device may be greatly affected by the change. For example, in the field of communication, in a mobile network of the fifth generation, so-called "5G", a high frequency range in a millimeter waveband is used. In such a case, when wiring lengths in a high frequency circuit vary, a coil length varies, and a stability of the device may be degraded.

Accordingly, in order to apply the glass substrate having through holes to such high frequency device of the next generation, the device will be required to be designed so that an influence to a stability of the device is minimized as much as possible.

The present invention, in consideration of the above-described problem, aims at providing a glass substrate having through holes that can be significantly applied also to a high frequency device.

According to an aspect of the present invention, a glass substrate includes a first surface; a second surface; and a plurality of through holes that penetrate from the first surface to the second surface.

Each of the through holes has an upper aperture with a diameter $\phi_1$ on the first surface, and a lower aperture with a diameter $\phi_2$ on the second surface.

Selected through holes are ten through holes randomly selected from the plurality of through holes.

A straight type through hole is a selected through hole, in which a constricted part with a diameter being less than a smaller diameter from among the diameter $\phi_1$ and the diameter $\phi_2$ is absent, and an X-type through hole is a selected through hole, in which a constricted part with a diameter $\phi_3$ being less than a smaller diameter from among the diameter $\phi_1$ and the diameter $\phi_2$ is present.

For each of the selected through holes, in a cross section of the selected through hole cut along an axis of expansion of the selected through hole, an approximated length L of a side wall is

[Math 1]

$$L = \sqrt{t^2 + \left(\frac{\phi_1 - \phi_2}{2}\right)^2} \qquad \text{formula (1)}$$

when the selected through hole is a straight type through hole, and

[Math 2]

$$L = \sqrt{\left(\frac{t}{2}\right)^2 + \left(\frac{\phi_1 - \phi_3}{2}\right)^2} + \sqrt{\left(\frac{t}{2}\right)^2 + \left(\frac{\phi_2 - \phi_3}{2}\right)^2} \qquad \text{formula (2)}$$

when the selected through hole is an X-type through hole, where t is a thickness of the glass substrate.

R values each expressed by a ratio of the approximate length of the side wall to the thickness of the glass substrate, L/t, fall within a range of 1 to 1.1.

A B value obtained by

[Math 3]

$$B = \frac{R_{max} - R_{min}}{R_{ave}} \times 100 \qquad \text{formula (3)}$$

where $R_{ave}$ is an average of the R values of the selected through holes, $R_{max}$ is a maximum of the R values of the selected through holes, and $R_{min}$ is a minimum of the R values of the selected through holes, is 5% or less.

According to an aspect of the present invention, there is provided a glass substrate having through holes that can be significantly applied also to a high frequency device.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

In the following, with reference to drawings, embodiments of the present invention will be described.

(Glass Substrate According to Embodiment)

Figure 1:
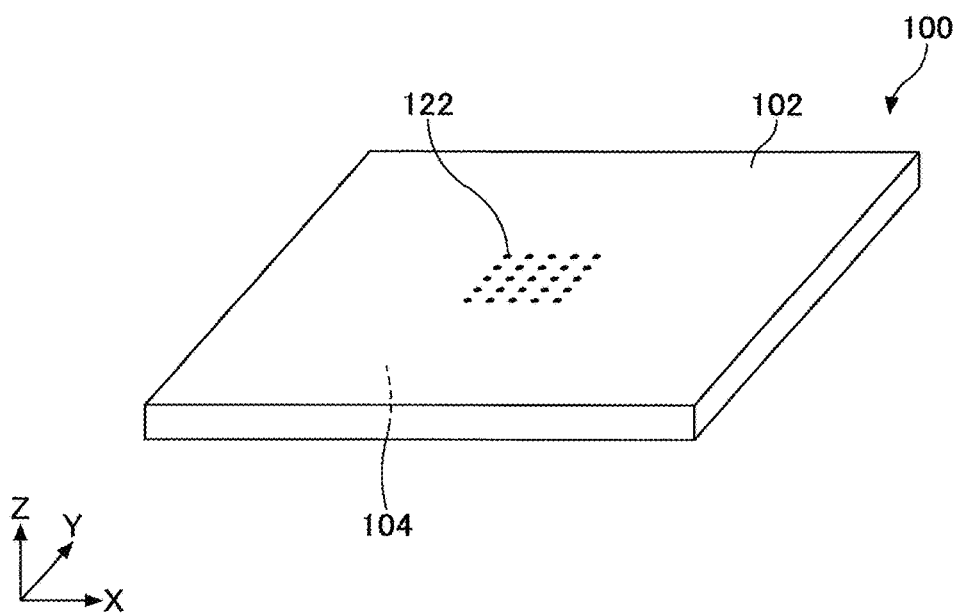
FIG. 1 is a perspective view schematically depicting an example of a glass substrate according to an embodiment.

FIG. 1 is a perspective view schematically depicting an example of a glass substrate having through holes according to an embodiment (in the following, referred to as a "glass substrate including through holes").

As illustrated in FIG. 1, the glass substrate including through holes 100 has a first surface 102 and a second surface 104 that are opposite to each other. Moreover, the glass substrate including through holes 100 has numerous through holes 122 that penetrate from the first surface 102 to the second surface 104.

Note that FIG. 1 depicts an example in which the glass substrate including through holes 100 has a substantially rectangular shape. However, the aforementioned configuration is merely an example, and it is necessary to note that the shape of the glass substrate including through holes 100 is not particularly limited. For example, the shape of the glass substrate including through holes 100 may be a circle or may be an ellipse.

Moreover, FIG. 1 depicts an example in which the through holes 122 are arranged substantially at the center of the glass substrate including through holes 100. However, it is necessary to note that the position of arrangement of the through holes 122 is not particularly limited. For example, the through holes 122 may be arranged, in addition to substantially at the center portion of the glass substrate including through holes 100, or instead of at the center portion, substantially near a corner portion of the glass substrate including through holes 100 or the like.

Note that modes of cross section of the through holes 122 can be classified into two categories. In the following, with reference to FIG. 2 and FIG. 3, such two types of modes of cross section of the through holes will be described.

Figure 2:
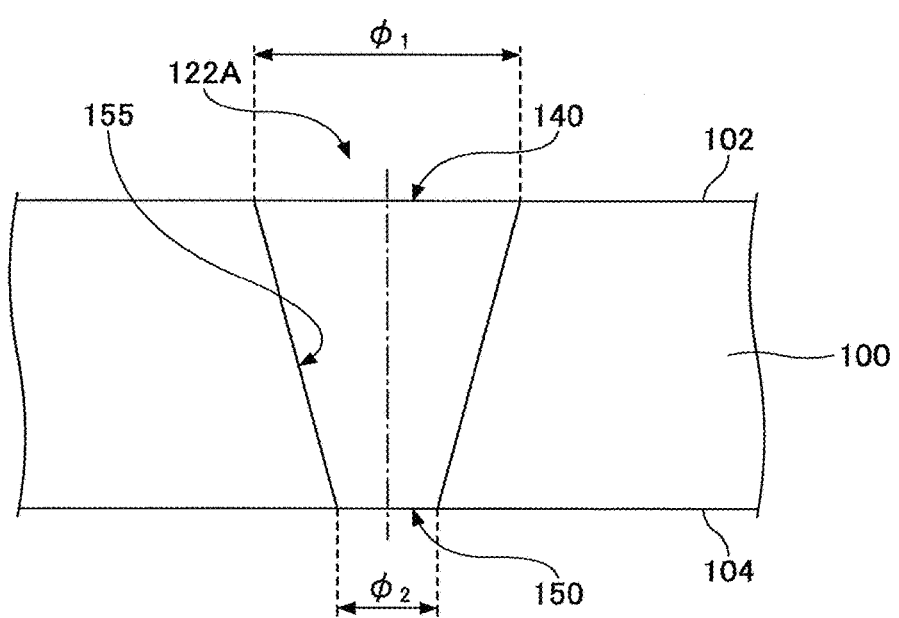
FIG. 2 is a cross-sectional view schematically depicting a first mode of a cross section of a through hole that can be included in the glass substrate according to the embodiment.

FIG. 2 schematically depicts an example of a through hole having a first mode of cross section. Note that FIG. 2 corresponds to a cross section including an axis of expansion of the through hole.

As illustrated in FIG. 2, the through hole 122A includes an upper aperture 140 formed on the first surface 102 of the glass substrate 100, a lower aperture 150 formed on the second surface 104, and a side wall 155.

The upper aperture 140 has a substantially circular shape with a diameter of $\phi_2$, the lower aperture 150 has a substantially circular shape with a diameter of $\phi_2$, and the diameter $\phi_2$ is greater than or equal to the diameter $\phi_2$.

The through hole 122A has a substantially V-shaped cross section (the diameter $\phi_1$ is greater than the diameter $\phi_2$), or a substantially I-shaped cross section (the diameter $\phi_2$ is equal to the diameter $\phi_2$). In the following, the through hole 122A having the aforementioned mode will also be referred to as a "straight type through hole" 122A.

Figure 3:
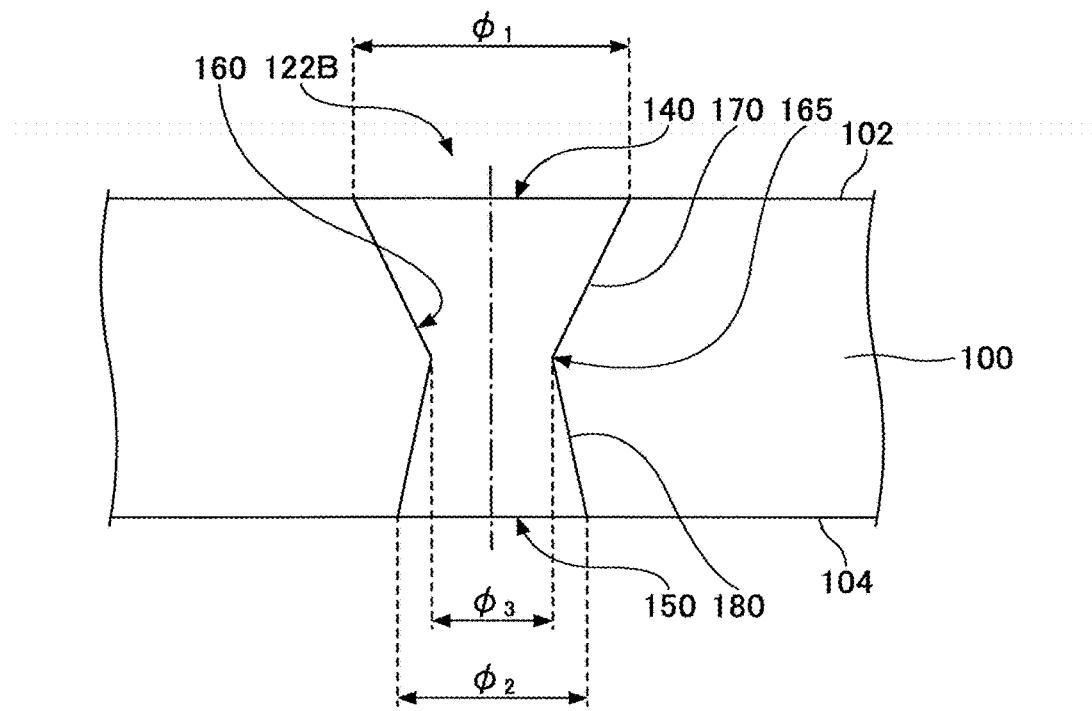
FIG. 3 is a cross-sectional view schematically depicting a second mode of a cross section of a through hole that can be included in the glass substrate according to the embodiment.

FIG. 3 schematically depicts an example of a through hole having a second mode of cross section. Note that FIG. 3 corresponds to a cross section including an axis of expansion of the through hole.

As illustrated in FIG. 3, the through hole 122B also includes an upper aperture 140 formed at the first surface 102 of the glass substrate 100, a lower aperture 150 formed at the second surface 104, and a side wall 160. The upper aperture 140 has a substantially circular shape with a diameter of $\phi_1$, the lower aperture 150 has a substantially circular shape with a diameter of $\phi_2$, and the diameter $\phi_2$ is greater than or equal to the diameter $\phi_2$.

However, different from the aforementioned straight type through hole 122A, the through hole 122B has a portion inside the through hole having a diameter that is less than the upper aperture 140 and the lower aperture 150, i.e. a constricted part 165. The diameter of the constricted part 165 is $\phi_3$.

In the cross section of the through hole 122B, the side wall 160 cannot be approximated as a single line. That is, in the cross section, the side wall 160 is constituted of a combination of a first portion 170 above the constricted part 165, and a second portion 180 below the constricted part 165.

In the following, the through hole 122B having the aforementioned mode will also be referred to as an "X-type through hole" 122B.

In other words, the through hole 122, in which a constricted part 165 having a diameter less than the diameter $\phi_1$ and the diameter $\phi_2$ is not present, is referred to as a straight type through hole 122A, and the through hole 122, in which a constricted part 165 having a diameter less than the diameter $\phi_1$ and the diameter $\phi_2$ is present, is referred to as an X-type through hole 122B.

Here, in order to understand the feature of the glass substrate including through holes 100 illustrated in FIG. 1, the following operation will be performed.

First, on the glass substrate including through holes 100, ten through holes 122 are selected randomly from the plurality of through holes. The selected through holes are particularly referred to as "selected through holes". Moreover, each of the selected through holes is observed from a cross section including an axis of expansion, and it is determined whether a selected through hole belongs to the aforementioned straight type through hole 122A or the X-type through hole 122B.

Note that, in practice, a shape of the cross section of the selected through hole often coincides with neither FIG. 2 (straight type through hole) nor FIG. 3 (X-type through hole). For example, when the selected through hole is viewed from the cross section, a shape of a side wall of the selected through hole may not be a line substantially, but may have both a curved part and a linear part. Moreover, for example, the side wall of the selected through hole often has a shape of "Y".

However, even in such a case, the aforementioned criteria for determination are employed. That is, a selected through hole, in which a constricted part with a diameter less than the diameter $\phi_1$ of the upper aperture and the diameter $\phi_2$ of the lower aperture is not present in a cross section and inside the through hole, is classified as the straight type through hole. Moreover, a selected through hole, in which a constricted part with a diameter less than the diameter $\phi_1$ and the diameter $\phi_2$ is present, is classified as the X-type through hole. For example, a selected through hole with a cross section having the shape of "Y", in which a constricted part is not present inside, is classified as the straight type through hole, and a selected through hole, in which a constricted part is present inside, is classified as the X-type through hole.

Note that a selected through hole having a plurality of constricted parts inside, is a "faulty through hole". In the present application, such a "faulty through hole" is not assumed.

Next, in the case where the selected through hole is a straight type through hole 122A, an approximated length L (mm) of the side wall 155 is obtained by formula (1) as follows:

[Math 4]

$$L = \sqrt{t^2 + \left(\frac{\phi_1 - \phi_2}{2}\right)^2}. \qquad \text{formula (1)}$$

Here, as described above, $\phi_1$ is a diameter of the upper aperture 140 of the straight type through hole 122A, and $\phi_2$ is a diameter of the lower aperture 150. Moreover, t (mm) is a thickness of the glass substrate 100.

In contrast, in the case where the selected through hole is an X-type through hole 122B, an approximated length L (mm) of the side wall 160 is obtained by formula (2) as follows:

[Math 5]

$$L = \sqrt{\left(\frac{t}{2}\right)^2 + \left(\frac{\phi_1 - \phi_3}{2}\right)^2} + \sqrt{\left(\frac{t}{2}\right)^2 + \left(\frac{\phi_2 - \phi_3}{2}\right)^2}. \qquad \text{formula (2)}$$

The aforementioned measurement is performed for all the selected through holes.

From results of the measurement, an R value expressed by a ratio of the approximated length to the thickness, L/t, is obtained.

Moreover, when an average of the R values of the selected through holes is $R_{ave}$, and a maximum and a minimum of the R values are $R_{max}$ and $R_{min}$, respectively, a B value is obtained by a formula (3) as follows:

[Math 6]

$$B = \frac{R_{max} - R_{min}}{R_{ave}} \times 100. \qquad \text{formula (3)}$$

From results of the aforementioned evaluation, the glass substrate including through holes 100 is found to be characterized by an R value falling within a range of 1 to 1.1 and a B value of 5% or less.

The results of evaluation indicate that lengths of the side walls 155, 160 of the respective through holes 122 are kept within a specific range, and variation in the lengths of the side walls 155, 160 is significantly controlled.

Therefore, when the glass substrate including through holes 100 provided with the aforementioned features is applied to a high frequency device, a problem of instability of a device due to variation of a coil length can be controlled significantly. Moreover, according to the features, the glass substrate including through holes 100 can be significantly applied also to a high frequency device of the next generation.

Note that, in the present application, the diameter $\phi_1$ of the upper aperture of a through hole is measured as follows. On the first surface of the glass substrate, an outline of the upper aperture of the through hole, observed using a length measuring device or the like by a vertical illumination, is approximated as a proximity circle by a least-squares method. A diameter of the proximity circle is defined as the diameter $\phi_1$ of the upper aperture of the through hole.

In the same way as above, the diameter $\phi_2$ of the lower aperture of the through hole is measured as follows. On the second surface of the glass substrate, a contour of the lower aperture of the through hole, observed using a length measuring device or the like by a vertical illumination, is approximated as a proximity circle by a least-squares method. A diameter of the proximity circle is defined as the diameter $\phi_2$ of the lower aperture of the through hole.

Moreover, in the case where the through hole is an X-type through hole, the diameter $\phi_3$ of the constricted part is measured as follows. When a transmission illumination is illuminated from the second surface side of the glass substrate, the smallest contour of the through hole observed using a length measurement device on the first surface or the second surface is approximated as a proximity circle by a least-squares method. A diameter of the proximity circle is defined as the diameter $\phi_3$ of the constricted part of the through hole.

(Details of Glass Substrate Including Through Holes 100)

Next, other features of each part or member contained in the glass substrate including through holes 100 will be described.

(Glass Substrate Including Through Holes 100)

A composition of the glass substrate used for the glass substrate including through holes 100 is not particularly limited. The glass substrate may be configured of an alkali-free glass, a quartz glass, or a photosensitive glass or the like.

A thickness of the glass substrate is not particularly limited. The thickness of the glass substrate may fall, for example, within a range of 0.05 mm to 0.8 mm, may fall within a range of 0.1 mm to 0.6 mm, and may fall within a range of 0.3 mm to 0.5 mm.

(Through Hole 122)

As described above, each of the selected through holes randomly selected from the through holes 122 has an upper aperture 140 with a diameter $\phi_1$ and a lower aperture 150 with a diameter $\phi_2$.

The diameter $\phi_1$ of the upper aperture 140 falls, for example, within a range of 10 μm top 200 μm. The diameter $\phi_1$ may fall within a range of 20 μm to 160 μm, and may fall within a range of 50 μm to 100 μm. Moreover, the diameter $\phi_2$ of the lower aperture 150 falls, for example, within a range of 5 μm to 150 μm. The diameter $\phi_2$ may fall within a range of 10 μm to 100 μm, and may fall within a range of 30 μm to 70 μm.

Moreover, in the selected through hole, as described above, the B value calculated using the formula (3) is 5° or less. The B value is preferably 2° or less, more preferably 1% or less, further preferably 0.5% or less, and particularly preferably 0.1% or less.

Similarly, the R value falls within a range of 1 to 1.1. The R value preferably falls within a range of 1 to 1.05, and more preferably falls within a range of 1 to 1.03.

A method of forming the through holes is not particularly limited.

The through holes 122 may be formed, for example, by irradiating the glass substrate with a laser light. For a laser device, a $CO_2$ laser device or a UV laser device can be used. For the laser device, a short-pulse laser device (picosecond laser device, femtosecond laser device or the like) may be used. Moreover, after the irradiation, the through holes may be subjected to an etching treatment. Moreover, at the stage of irradiation of laser light, non-through holes or void arrays may be formed, and through holes may be formed by the subsequent etching treatment. Furthermore, before the etching treatment, an annealing treatment may be performed. Alternatively, the through holes 122 may be formed by using a machining method, such as a drill boring method. Moreover, the through holes 122 may be formed by using a sandblast method. Furthermore, the through holes 122 may be formed by a reforming method using a photosensitive glass.

Note that in order to significantly control the variation of lengths of side walls of the through holes 122, at least one process of the following (i) to (iii) is preferably applied to the method of forming the through holes:

(i) when the glass substrate is irradiated with laser light to form through holes, a stage for fixing the glass substrate having a flatness of ±50 μm or less is preferably used;

(ii) when the glass substrate is irradiated with laser light to form through holes, air blow is performed at a site to be irradiated with laser light, to control a decrease in a laser power due to fumes or debris during processing; and (iii) when the glass substrate is irradiated with laser light to form through holes, an autofocus mechanism is applied in a laser optical system to maintain a focal length of a laser light for the glass substrate at a constant.

A person skilled in the art is assumed to be able to form through holes 122 using various methods other than the above-described method.

EXAMPLE

Next, examples of the present invention will be described.

Example 1

A glass substrate including through holes was manufactured using a method as follows. Moreover, the respective sizes of the formed through holes were measured.

First, a glass substrate (alkali-free glass) with a thickness of 0.33 mm was provided.

An approximately central portion of a first surface of the glass substrate was irradiated with a laser light, to form a hole group including about 400,000 through holes. A $CO_2$ laser was used for a laser light source.

Next, the glass substrate obtained as above was subjected to an etching treatment in a hydrofluoric acid solution. According to the etching treatment, each of the through holes was expanded and the thickness of the glass substrate was reduced to about 0.30 mm.

According to the aforementioned processes, a glass substrate including through holes was obtained.

From the through holes in the through hole group, ten through holes were randomly selected as selected through holes. Moreover, each of the selected through holes was cut along an axis of expansion, and a shape of a cross section was observed. All the ten selected through holes were straight type through holes.

Figure 4:
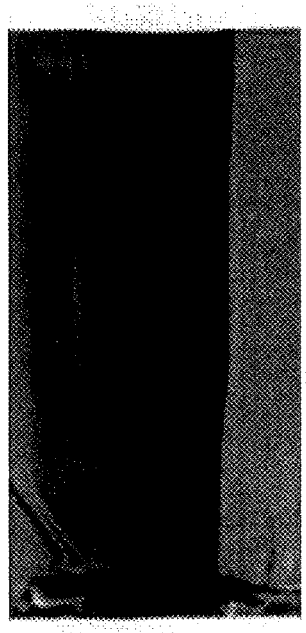
FIG. 4 is a photograph depicting an example of a cross section of a selected through hole according to Example 1.

FIG. 4 depicts an example of a configuration of a cross section of the selected through hole.

In each of the selected through holes, a diameter $\phi_1$ of an upper aperture and a diameter $\phi_2$ of a lower aperture were measured. Moreover, from results of the measurement, using the aforementioned formula (1) an approximated length of side wall, L, was calculated. Furthermore, using the aforementioned formula (3), a B value was calculated.

TABLE 1, in the following, shows measured values and the like for the respective selected through holes as a whole.

TABLE 1

| selected through hole No. | type of through hole | upper aperture diameter $\phi_1$ (mm) | lower aperture diameter $\phi_2$ (mm) | constricted part diameter $\phi_3$ (mm) | approximated length of side wall L (mm) | R value (%) |
|---|---|---|---|---|---|---|
| 1 | straight | 0.0758 | 0.0649 | — | 0.3030 | 1.00016 |
| 2 | straight | 0.0768 | 0.0657 | — | 0.3031 | 1.00017 |
| 3 | straight | 0.0798 | 0.0674 | — | 0.3031 | 1.00021 |
| 4 | straight | 0.0769 | 0.0666 | — | 0.3030 | 1.00014 |
| 5 | straight | 0.0771 | 0.0662 | — | 0.3030 | 1.00016 |
| 6 | straight | 0.0767 | 0.0637 | — | 0.3031 | 1.00023 |
| 7 | straight | 0.0785 | 0.0671 | — | 0.3031 | 1.00018 |
| 8 | straight | 0.0787 | 0.0670 | — | 0.3031 | 1.00019 |
| 9 | straight | 0.0789 | 0.0670 | — | 0.3031 | 1.00019 |
| 10 | straight | 0.0796 | 0.0677 | — | 0.3031 | 1.00019 |
| average (mm) | | 0.0779 | 0.0663 | — | | |
| maximum (mm) | | 0.0798 | 0.0677 | — | | |
| minimum (mm) | | 0.0758 | 0.0637 | — | | |
| average $R_{ave}$ | | | | 1.00018 | | |
| maximum $R_{max}$ | | | | 1.00023 | | |
| minimum $R_{min}$ | | | | 1.00014 | | |
| B value (%) | | | | 0.009 | | |

From TABLE 1, it was found that the maximum R value of the selected through holes was about 1.00023. Moreover, the B value in the ten selected through holes was found to be 0.009%.

Example 2

A glass substrate including through holes was manufactured using a method as follows. Moreover, the respective sizes of the formed through holes were measured.

First, a glass substrate (alkali-free glass) with a thickness of 0.40 mm was provided.

An approximately central portion of a first surface of the glass substrate was irradiated with a laser light, to form a hole group including about 400,000 of through holes. A $CO_2$ laser was used for a laser light source.

Next, the glass substrate obtained as above was subjected to an etching treatment in a hydrofluoric acid solution. According to the etching treatment, each of the through holes was expanded and the thickness of the glass substrate was reduced to about 0.38 mm.

According to the aforementioned processes, a glass substrate including through holes was obtained.

From the through holes in the through hole group, ten through holes were randomly selected as selected through holes. Moreover, each of the selected through holes was cut along an axis of expansion, and a shape of a cross section was observed. All the ten selected through holes were straight type through holes.

In each of the selected through holes, a diameter $\phi_1$ of an upper aperture and a diameter $\phi_2$ of a lower aperture were measured. Moreover, from results of the measurement, using the aforementioned formula (1) an approximated length of side wall, L, was calculated. Furthermore, using the aforementioned formula (3), a B value was calculated.

TABLE 2, in the following, shows measured values and the like for the respective selected through holes as a whole.

TABLE 2

| selected through hole No. | type of through hole | upper aperture diameter $\phi_1$ (mm) | lower aperture diameter $\phi_2$ (mm) | constricted part diameter $\phi_3$ (mm) | approximated length of side wall L (mm) | R value (%) |
|---|---|---|---|---|---|---|
| 1 | straight | 0.0826 | 0.0461 | — | 0.3754 | 1.00118 |
| 2 | straight | 0.0823 | 0.0451 | — | 0.3755 | 1.00123 |
| 3 | straight | 0.0834 | 0.0506 | — | 0.3754 | 1.00096 |
| 4 | straight | 0.0845 | 0.0520 | — | 0.3754 | 1.00094 |
| 5 | straight | 0.0848 | 0.0514 | — | 0.3754 | 1.00099 |
| 6 | straight | 0.0845 | 0.0495 | — | 0.3754 | 1.00109 |
| 7 | straight | 0.0847 | 0.0520 | — | 0.3754 | 1.00095 |
| 8 | straight | 0.0851 | 0.0529 | — | 0.3753 | 1.00092 |
| 9 | straight | 0.0846 | 0.0527 | — | 0.3753 | 1.00090 |
| 10 | straight | 0.0840 | 0.0498 | — | 0.3754 | 1.00104 |
| average (mm) | | 0.0841 | 0.0502 | — | | |
| maximum (mm) | | 0.0851 | 0.0529 | — | | |
| minimum (mm) | | 0.0823 | 0.0451 | — | | |
| average $R_{ave}$ | | | | | | 1.00102 |
| maximum $R_{max}$ | | | | | | 1.00123 |
| minimum $R_{min}$ | | | | | | 1.00090 |
| B value (%) | | | | | | 0.032 |

From TABLE 2, it was found that the maximum R value of the selected through hole was about 1.0012. Moreover, the B value in the ten selected through holes was found to be 0.032%.

Example 3

A glass substrate including through holes was manufactured using a method as follows. Moreover, the respective sizes of the formed through holes were measured.

First, a glass substrate (alkali-free glass) with a thickness of 0.10 mm was provided.

An approximately central portion of a first surface of the glass substrate was irradiated with a laser light, to form a hole group including about 10,000 through holes. A $CO_2$ laser was used for a laser light source.

Next, the glass substrate obtained as above was subjected to an etching treatment in a hydrofluoric acid solution. According to the etching treatment, each of the through holes was expanded and the thickness of the glass substrate was reduced to about 0.09 mm.

According to the aforementioned processes, a glass substrate including through holes was obtained.

From the through holes in the through hole group, ten through holes were randomly selected as selected through holes. Moreover, each of the selected through holes was cut along an axis of expansion, and a shape of a cross section was observed. All the ten selected through holes were straight type through holes.

In each of the selected through holes, a diameter $\phi_1$ of an upper aperture and a diameter $\phi_2$ of a lower aperture were measured. Moreover, from results of the measurement, using the aforementioned formula (1) an approximated length of side wall, L, was calculated. Furthermore, using the aforementioned formula (3), a B value was calculated.

TABLE 3, in the following, shows measured values and the like for the respective selected through holes as a whole.

TABLE 3

| selected through hole No. | type of through hole | upper aperture diameter $\phi_1$ (mm) | lower aperture diameter $\phi_2$ (mm) | constricted part diameter $\phi_3$ (mm) | approximated length of side wall L (mm) | R value (%) |
|---|---|---|---|---|---|---|
| 1 | straight | 0.0680 | 0.0403 | — | 0.0871 | 1.01288 |
| 2 | straight | 0.0690 | 0.0409 | — | 0.0871 | 1.01326 |
| 3 | straight | 0.0695 | 0.0408 | — | 0.0872 | 1.01383 |
| 4 | straight | 0.0682 | 0.0401 | — | 0.0871 | 1.01326 |
| 5 | straight | 0.0691 | 0.0393 | — | 0.0873 | 1.01490 |
| 6 | straight | 0.0698 | 0.0413 | — | 0.0872 | 1.01363 |
| 7 | straight | 0.0677 | 0.0399 | — | 0.0871 | 1.01298 |
| 8 | straight | 0.0681 | 0.0406 | — | 0.0871 | 1.01270 |
| 9 | straight | 0.0709 | 0.0405 | — | 0.0873 | 1.01550 |
| 10 | straight | 0.0688 | 0.0404 | — | 0.0872 | 1.01354 |
| average (mm) | | 0.0689 | 0.0404 | — | | |
| maximum (nun) | | 0.0709 | 0.0413 | — | | |
| minimum (mm) | | 0.0677 | 0.0393 | — | | |
| average $R_{ave}$ | | | | | | 1.01365 |
| maximum $R_{max}$ | | | | | | 1.01550 |
| minimum $R_{min}$ | | | | | | 1.01270 |
| B value (%) | | | | | | 0.276 |

From TABLE 3, it was found that the maximum R value of the selected through holes was about 1.0155. Moreover, the B value in the ten selected through holes was found to be 0.276%.

Example 4

A glass substrate including through holes was manufactured using a method as follows. Moreover, the respective sizes of the formed through holes were measured.

First, a glass substrate (alkali-free glass) with a thickness of 0.10 mm was provided.

An approximately central portion of a first surface of the glass substrate was irradiated with a laser light, to form a hole group including about 10,000 through holes. A $CO_2$ laser was used for a laser light source.

Next, the glass substrate obtained as above was subjected to an etching treatment in a hydrofluoric acid solution. According to the etching treatment, each of the through holes was expanded and the thickness of the glass substrate was reduced to about 0.09 mm.

According to the aforementioned processes, a glass substrate including through holes was obtained.

From the through holes in the through hole group, ten through holes were randomly selected as selected through holes. Moreover, each of the selected through holes was cut along an axis of expansion, and a shape of a cross section was observed. All the ten selected through holes were straight type through holes.

In each of the selected through holes, a diameter $\phi_2$ of an upper aperture and a diameter $\phi_2$ of a lower aperture were measured. Moreover, from results of the measurement, using the aforementioned formula (1) an approximated length of side wall, L, was calculated. Furthermore, using the aforementioned formula (3), a B value was calculated.

TABLE 4, in the following, shows measured values and the like for the respective selected through holes as a whole.

TABLE 4

| selected through hole No. | type of through hole | upper aperture diameter $\phi_1$ (mm) | lower aperture diameter $\phi_2$ (mm) | constricted part diameter $\phi_3$ (mm) | approximated length of side wall L (mm) | R value (%) |
|---|---|---|---|---|---|---|
| 1 | straight | 0.0671 | 0.0242 | — | 0.0925 | 1.02801 |
| 2 | straight | 0.0676 | 0.0352 | — | 0.0914 | 1.01607 |
| 3 | straight | 0.0689 | 0.0408 | — | 0.0911 | 1.01211 |
| 4 | straight | 0.0673 | 0.0339 | — | 0.0915 | 1.01707 |
| 5 | straight | 0.0679 | 0.0393 | — | 0.0911 | 1.01254 |
| 6 | straight | 0.0688 | 0.0413 | — | 0.0910 | 1.01160 |
| 7 | straight | 0.0675 | 0.0399 | — | 0.0911 | 1.01169 |
| 8 | straight | 0.0698 | 0.0425 | — | 0.0910 | 1.01144 |
| 9 | straight | 0.0687 | 0.0414 | — | 0.0910 | 1.01144 |
| 10 | straight | 0.0693 | 0.0404 | — | 0.0912 | 1.01281 |
| average (mm) | | 0.0683 | 0.0379 | — | | |
| maximum (mm) | | 0.0698 | 0.0425 | — | | |
| minimum (mm) | | 0.0671 | 0.0242 | — | | |
| average $R_{ave}$ | | | | | 1.01448 | |
| maximum $R_{max}$ | | | | | 1.02801 | |
| minimum $R_{min}$ | | | | | 1.01144 | |
| B value (%) | | | | | 1.634 | |

TABLE 5

| selected through hole No. | type of through hole | upper aperture diameter $\phi_1$ (mm) | lower aperture diameter $\phi_2$ (mm) | constricted part diameter $\phi_3$ (mm) | approximated length of side wall L (mm) | R value (%) |
|---|---|---|---|---|---|---|
| 1 | X-type | 0.0347 | 0.0213 | 0.0116 | 0.4843 | 1.00067 |
| 2 | X-type | 0.0356 | 0.0211 | 0.0121 | 0.4843 | 1.00068 |
| 3 | X-type | 0.0353 | 0.0208 | 0.0131 | 0.4843 | 1.00059 |
| 4 | X-type | 0.0353 | 0.0210 | 0.0126 | 0.4843 | 1.00062 |
| 5 | X-type | 0.0354 | 0.0208 | 0.0122 | 0.4843 | 1.00065 |
| 6 | X-type | 0.0356 | 0.0212 | 0.0112 | 0.4844 | 1.00074 |
| 7 | X-type | 0.0353 | 0.0207 | 0.0122 | 0.4843 | 1.00065 |
| 8 | X-type | 0.0351 | 0.0210 | 0.0125 | 0.4843 | 1.00062 |
| 9 | X-type | 0.0355 | 0.0207 | 0.0120 | 0.4843 | 1.00067 |
| 10 | X-type | 0.0354 | 0.0209 | 0.0126 | 0.4843 | 1.00063 |
| average (mm) | | 0.0353 | 0.0210 | — | | |
| maximum (mm) | | 0.0356 | 0.0213 | — | | |
| minimum (mm) | | 0.0347 | 0.0207 | — | | |
| average $R_{ave}$ | | | | | 1.00065 | |
| maximum $R_{max}$ | | | | | 1.00074 | |
| minimum $R_{min}$ | | | | | 1.00059 | |
| B value (%) | | | | | 0.015 | |

From TABLE 4, it was found that the maximum R value of the selected through holes was about 1.028. Moreover, the B value in the ten selected through holes was found to be 1.634%.

Example 5

A glass substrate including through holes was manufactured using a method as follows. Moreover, the respective sizes of the formed through holes were measured.

First, a glass substrate (alkali-free glass) with a thickness of 0.50 mm was provided.

An approximately central portion of a first surface of the glass substrate was irradiated with a laser light, to form a hole group including about 10,000 through holes. A UV laser was used for a laser light source.

Next, the glass substrate obtained as above was subjected to an etching treatment in a hydrofluoric acid solution. According to the etching treatment, each of the through holes was expanded and the thickness of the glass substrate was reduced to about 0.48 mm.

According to the aforementioned processes, a glass substrate including through holes was obtained.

From the through holes in the through hole group, ten through holes were randomly selected as selected through holes. Moreover, each of the selected through holes was cut along an axis of expansion, and a shape of a cross section was observed. All of the ten selected through holes were X-type through holes.

Figure 5:
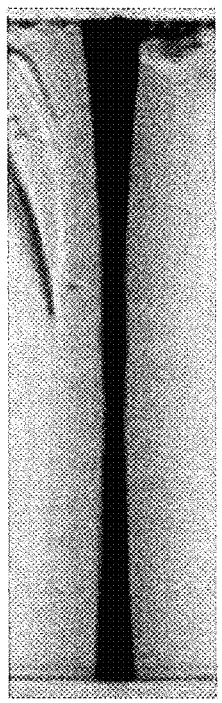
FIG. 5 is a photograph depicting an example of a cross section of a selected through hole according to Example 5.

FIG. 5 depicts an example of a configuration of a cross section of the selected through hole.

In each of the selected through holes, a diameter $\phi_1$ of an upper aperture and a diameter $\phi_2$ of a lower aperture were measured. Moreover, from results of the measurement, using the aforementioned formula (2) an approximated length of side wall, L, was calculated. Furthermore, using the aforementioned formula (3), a B value was calculated.

TABLE 5, in the following, shows measured values and the like for the respective selected through holes as a whole.

From TABLE 5, it was found that the maximum R value of the selected through holes was about 1.00074. Moreover, the B value in the ten selected through holes was found to be 0.015%.

The glass substrate according to the present invention can be significantly applied as a glass substrate provided with through holes for a high frequency device that processes high frequency signals. Specifically, the glass substrate according to the present invention can be advantageously significantly applied to a device, to which a glass substrate provided with through holes can be applied, including a communication device, a high-frequency filter component, a band-pass filter such as a waveguide, and the like.

As described above, the preferred embodiments and the like have been described in detail. However, the present invention is not limited to the above-described specific embodiments, but various variations and modifications may be made without deviating from the scope of the present invention.

REFERENCE SIGNS LIST 100 glass substrate including through holes
102 first surface
104 second surface
122 through hole
122A straight type through hole
122B X-type through hole
140 upper aperture
150 lower aperture
155 side wall
160 side wall
165 constricted part
170 first portion
180 second portion

What is claimed is:

1. A glass substrate comprising:
   a first surface;
   a second surface; and
   a plurality of through holes that penetrate from the first surface to the second surface,
   wherein each of the through holes has an upper aperture with a diameter $\phi_1$ on the first surface, and a lower aperture with a diameter $\phi_2$ on the second surface,
   wherein selected through holes are ten through holes randomly selected from the plurality of through holes,
   wherein a straight type through hole is a selected through hole, in which a constricted part with a diameter being less than a smaller diameter from among the diameter $\phi_1$ and the diameter $\phi_2$ is absent, and
   an X-type through hole is a selected through hole, in which a constricted part with a diameter $\phi_3$ being less than a smaller diameter from among the diameter $\phi_1$ and the diameter $\phi_2$ is present,
   wherein, for each of the selected through holes, in a cross section of the selected through hole cut along an axis of expansion of the selected through hole, an approximated length L of a side wall is

[Math 1]

$$L = \sqrt{t^2 + \left(\frac{\phi_1 - \phi_2}{2}\right)^2} \quad \text{formula (1)}$$

when the selected through hole is a straight type through hole, and

[Math 2]

$$L = \sqrt{\left(\frac{t}{2}\right)^2 + \left(\frac{\phi_1 - \phi_3}{2}\right)^2} + \sqrt{\left(\frac{t}{2}\right)^2 + \left(\frac{\phi_2 - \phi_3}{2}\right)^2} \quad \text{formula (2)}$$

when the selected through hole is an X-type through hole, where t is a thickness of the glass substrate,
   wherein R values each expressed by a ratio of the approximate length of the side wall to the thickness of the glass substrate, L/t, fall within a range of 1 to 1.1, and
   wherein a B value obtained by

[Math 3]

$$B = \frac{R_{max} - R_{min}}{R_{ave}} \times 100 \quad \text{formula (3)}$$

where $R_{ave}$ is an average of the R values of the selected through holes, $R_{max}$ is a maximum of the R values of the selected through holes, and $R_{min}$ is a minimum of the R values of the selected through holes, is 5% or less.

2. The glass substrate according to claim 1,
   wherein the B value is 2% or less.
3. The glass substrate according to claim 1,
   wherein the R values fall within a range of 1 to 1.05.
4. The glass substrate according to claim 1,
   wherein the thickness of the glass substrate falls within a range of 0.05 mm to 0.8 mm.
5. The glass substrate according to claim 1,
   wherein the diameter $\phi_1$ falls within a range of 10 μm to 200 μm, and
   wherein the diameter $\phi_2$ falls within a range of 5 μm to 150 μm.
6. The glass substrate according to claim 2,
   wherein the R values fall within a range of 1 to 1.05.
7. The glass substrate according to claim 2,
   wherein the thickness of the glass substrate falls within a range of 0.05 mm to 0.8 mm.
8. The glass substrate according to claim 2,
   wherein the diameter $\phi_1$ falls within a range of 10 μm to 200 μm, and
   wherein the diameter $\phi_2$ falls within a range of 5 μm to 150 μm.
9. The glass substrate according to claim 3,
   wherein the thickness of the glass substrate falls within a range of 0.05 to 0.8 mm.
10. The glass substrate according to claim 3,
    wherein the diameter $\phi_1$ falls within a range of 10 μm to 200 μm, and
    wherein the diameter $\phi_2$ falls within a range of 5 μm to 150 μm.
11. The glass substrate according to claim 4,
    wherein the diameter $\phi_1$ falls within a range of 10 μm to 200 μm, and
    wherein the diameter $\phi_1$ falls within a range of 5 μm to 150 μm.
12. A glass substrate for a high frequency device, comprising:
    the glass substrate according to claim 1.

* * * * *